United States Patent
Butzmann

(10) Patent No.: US 9,921,270 B2
(45) Date of Patent: Mar. 20, 2018

(54) BATTERY SYSTEM WITH CELL VOLTAGE DETECTING UNITS

(75) Inventor: Stefan Butzmann, Beilstein (DE)

(73) Assignees: Robert Bosch GmbH, Stuttgart (DE); Samsung SDI Co., Ltd., Yongin-si, Gyeonggi-do (KR)

(*) Notice: Subject to any disclaimer, the term of this patent is extended or adjusted under 35 U.S.C. 154(b) by 488 days.

(21) Appl. No.: 13/822,807

(22) PCT Filed: Aug. 12, 2011

(86) PCT No.: PCT/EP2011/063947
§ 371 (c)(1),
(2), (4) Date: Jun. 3, 2013

(87) PCT Pub. No.: WO2012/034798
PCT Pub. Date: Mar. 22, 2012

(65) Prior Publication Data
US 2013/0300426 A1 Nov. 14, 2013

(30) Foreign Application Priority Data
Sep. 14, 2010 (DE) .......... 10 2010 040 721

(51) Int. Cl.
*G01R 31/36* (2006.01)
*G01R 35/00* (2006.01)
(Continued)

(52) U.S. Cl.
CPC ....... *G01R 31/362* (2013.01); *G01R 31/3658* (2013.01); *H01M 10/4285* (2013.01);
(Continued)

(58) Field of Classification Search
CPC ...................................................... G01R 31/36
(Continued)

(56) References Cited

U.S. PATENT DOCUMENTS 4,257,098 A * 3/1981 Lacy ............... G01V 1/223
367/74
4,891,973 A * 1/1990 Bollweber et al. .......... 73/146.5
(Continued)

FOREIGN PATENT DOCUMENTS

WO 99/27628 A1 6/1999

OTHER PUBLICATIONS

International Search Report corresponding to PCT Application No. PCT/EP2011/063947, dated Nov. 18, 2011 (German and English language document) (5 pages).

*Primary Examiner* — Samuel Berhanu
*Assistant Examiner* — Tarikh Rankine
(74) *Attorney, Agent, or Firm* — Maginot, Moore & Beck LLP

(57) ABSTRACT

A battery system with at least one module includes a plurality of battery cells. A cell voltage detecting circuit is associated with each battery cell of the plurality of battery cells. The cell voltage detecting circuits of the at least one module are connected to a multiplexer. An output of the multiplexer is connected to a communication bus via an analog-digital converter. The communication bus is connected to an evaluating unit. The multiplexer is additionally connected to at least one auxiliary voltage source that is known to the evaluating unit. In a method for monitoring a battery system with at least one module including a plurality of battery cells, a voltage of each of the battery cells is detected and fed to an evaluating unit via a cell voltage detecting unit. An output signal of the cell voltage detecting unit is tested for plausibility.

5 Claims, 3 Drawing Sheets

(51) Int. Cl.
*H02J 7/00* (2006.01)
*H01M 10/48* (2006.01)
*H01M 10/42* (2006.01)

(52) U.S. Cl.
CPC ....... *H01M 10/482* (2013.01); *G01R 31/3606* (2013.01); *G01R 31/3648* (2013.01); *H01M 10/425* (2013.01); *H01M 10/48* (2013.01); *H02J 7/0014* (2013.01); *H02J 7/0016* (2013.01)

(58) Field of Classification Search
USPC ........................................................ 324/434
See application file for complete search history.

(56) References Cited

U.S. PATENT DOCUMENTS

| | | | |
|---|---|---|---|
| 5,710,503 A * | 1/1998 | Sideris et al. ................ 324/431 | |
| 6,396,426 B1 * | 5/2002 | Balard ............. G11B 20/10009 | |
| | | | 341/118 |
| 7,579,842 B2 * | 8/2009 | Hunter et al. ................ 324/426 | |
| 2004/0095249 A1 | 5/2004 | Zaccaria | |
| 2006/0170398 A1 * | 8/2006 | Gangsto ................ H02J 7/0016 | |
| | | | 320/132 |
| 2006/0259280 A1 * | 11/2006 | Zaccaria ............ G01R 31/3648 | |
| | | | 702/188 |
| 2008/0164882 A1 | 7/2008 | Jaeger et al. | |
| 2009/0160401 A1 * | 6/2009 | Dishman et al. ............. 320/119 | |
| 2010/0133025 A1 * | 6/2010 | Flett ........................... 180/65.22 | |
| 2012/0038322 A1 * | 2/2012 | Moorhead ........... B60L 11/1861 | |
| | | | 320/136 |

* cited by examiner

BATTERY SYSTEM WITH CELL VOLTAGE DETECTING UNITS

This application is a 35 U.S.C. § 371 National Stage Application of PCT/EP2011/063947, filed on Aug. 12, 2011, which claims the benefit of priority to Serial No. DE 10 2010 040 721.6, filed on Sep. 14, 2010 in Germany, the disclosures of which are incorporated herein by reference in their entirety.

The present disclosure relates to a battery system, a method for monitoring a battery system and a motor vehicle having the battery system according to the disclosure.

BACKGROUND

It is apparent that in future both static applications, for example in the case of wind power installations, and vehicles, for example in hybrid and electric vehicles, will make increasing use of new battery systems on which very great demands in terms of reliability are made.

The background to these great demands is that failure of the battery system can result in failure of the entire system. By way of example, in an electric vehicle, power failure of the traction battery results in what is known as a "breakdown". Furthermore, the failure of a battery can result in a safety-related problem. In wind power installations, for example, batteries are used in order to protect the installation against inadmissible operating states in a high wind by means of rotor blade adjustment.

The block diagram for a battery system based on the prior art is shown in FIG. 1. A battery system denoted as a whole by 100 comprises a multiplicity of battery cells 10 which are combined in a module 24. In addition, a charging and isolating device 12, which comprises an isolating switch 14, a charging switch 16 and a charging resistor 18, is provided. In addition, the battery system 100 may comprise an isolator device 20 having an isolator switch 22.

For safe operation of the battery system 100, it is absolutely necessary for each battery cell 10 to be operated within a permitted operating range (voltage range, temperature range, current limits). If a battery cell 10 is outside these limits, it needs to be removed from the cell complex. If the battery cells 10 are connected in series (as shown in FIG. 1), failure of an individual battery cell 10 therefore results in failure of the entire battery system 100.

Particularly in hybrid and electric vehicles, batteries in lithium ion or nickel metal hybrid technology are used which have a large number of electrochemical battery cells connected in series. A battery management unit is used to monitor the battery and is intended to ensure not only safety monitoring but also as long a life as possible. By way of example, a cell voltage sensing unit is thus used.

FIG. 2 shows the known use of a contemporary cell voltage sensing unit.

FIG. 2 shows an architecture which is known from the prior art for typical cell voltage sensing. In this case, each module 24 with its battery cells 10 has an associated cell voltage sensing unit 26. The cell voltage sensing unit 26 comprises a multiplexer 28 which senses the voltage of each of the individual battery cells 10 by using a number of channels 30 which corresponds to the number of battery cells 10. The multiplexer 28 is connected via an analog-to-digital converter 32 to a gateway 34 which is coupled to a communication bus 36. The communication bus 36 has a central microcontroller 38 connected to it. This central microcontroller 38 can therefore be used to sense and evaluate the voltages of the individual battery cells 10. The microcontroller 38 may be part of a battery management unit.

As clarified by FIG. 2, a plurality of modules 24 having battery cells 10 may be arranged in series in this case, said modules each having a dedicated cell voltage sensing unit 26.

The multiplexers 28 have auxiliary inputs 40, which are indicated here, which are known to be able to be used for temperature measurement by allowing resistance values of NTC resistors to be sensed.

A drawback of the known cell voltage monitoring is that a malfunction in the cell voltage sensing unit, particularly in the analog-to-digital converter, cannot be identified. The data transmitted by the analog-to-digital converter are considered by the evaluation unit to be the actual voltage values as provided. If these are erroneous, however, the entire battery system may behave incorrectly.

SUMMARY

The disclosure provides a battery system having at least one module which comprises a multiplicity of battery cells, wherein each battery cell has an associated cell voltage sensing circuit, the cell voltage sensing circuits of a module are connected to a multiplexer, and an output of the multiplexer is connected via an analog-to-digital converter to a communication bus which is connected to an evaluation unit, wherein the multiplexer is additionally connected to at least one auxiliary voltage source which is known to the evaluation unit. This advantageously allows any malfunctions in the analog-to-digital converter or in a reference associated with the analog-to-digital converter to be identified. By virtue of the known auxiliary voltage source being read into the multiplexer, said malfunctions are also transmitted to the evaluation unit via the analog-to-digital converter and the communication bus. Since the evaluation unit knows the auxiliary voltage source, the known voltage value associated with the auxiliary voltage source can be expected. When this known voltage value is read, it can be assumed that the analog-to-digital converter is working properly. If this known voltage value is not identified, however, a malfunction in the analog-to-digital converter or an erroneous voltage reference for the analog-to-digital converter can be inferred.

In a preferred refinement of the disclosure, the known auxiliary voltage source used is a low frequency oscillator. This particularly advantageously allows the low frequency voltage change determined by the oscillator to be identified from the multiplex signal. Particularly if, in one preferred refinement, a square wave oscillator is used in which at least one of the two possible levels, high and low, has a previously known precise voltage, it is a particularly simple matter to detect the auxiliary voltage signal routed by the multiplexer by using the central evaluation unit. If this pulsating voltage signal is not detected, a malfunction in the analog-to-digital converter can be inferred.

The disclosure also provides a method for monitoring a battery system having at least one module having a multiplicity of battery cells, in which a voltage for each of the battery cells is sensed and is supplied via a cell voltage sensing unit to an evaluation unit, wherein the output signal from the cell voltage sensing unit is checked for plausibility. This makes it a simple matter to check that the cell voltage sensing unit is working properly and to verify the provided output signals from the cell voltage sensing unit.

Preferably, in addition to the cell voltages of the battery cells at least one defined known auxiliary voltage is routed via the cell voltage sensing unit and is then evaluated. The effect very advantageously achieved by this is that the output signal is monitored for the expected auxiliary voltage signal in a simple manner. If this expected auxiliary voltage signal is identified, it can be inferred that the cell voltage sensing unit is working properly. If the expected auxiliary voltage signal is not identified, however, there may be an error within the cell voltage sensing unit, which means that an appropriate error management system is used to disconnect the battery system, to change it over or to make allowance for it in the further battery management in another suitable manner.

A further aspect of the disclosure relates to a motor vehicle which comprises the battery system according to the disclosure.

Overall, the effect which can be achieved by the battery system according to the disclosure and the method according to the disclosure is that the reliability of the battery system can be checked and any malfunctions are identified in good time in order to prevent consequential damage as a result of unreliably operating battery systems.

BRIEF DESCRIPTION OF THE DRAWINGS

Exemplary embodiments of the disclosure are explained in more detail with reference to the description below and the drawings, in which.

DETAILED DESCRIPTION

Figure 1:
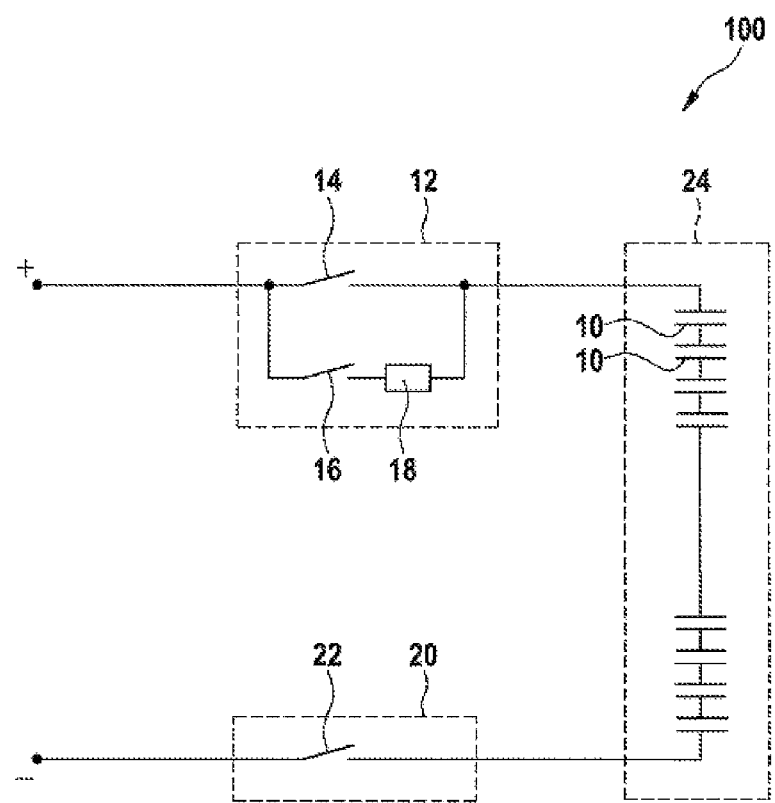
FIG. 1 shows a battery system based on the prior art.
Figure 2:
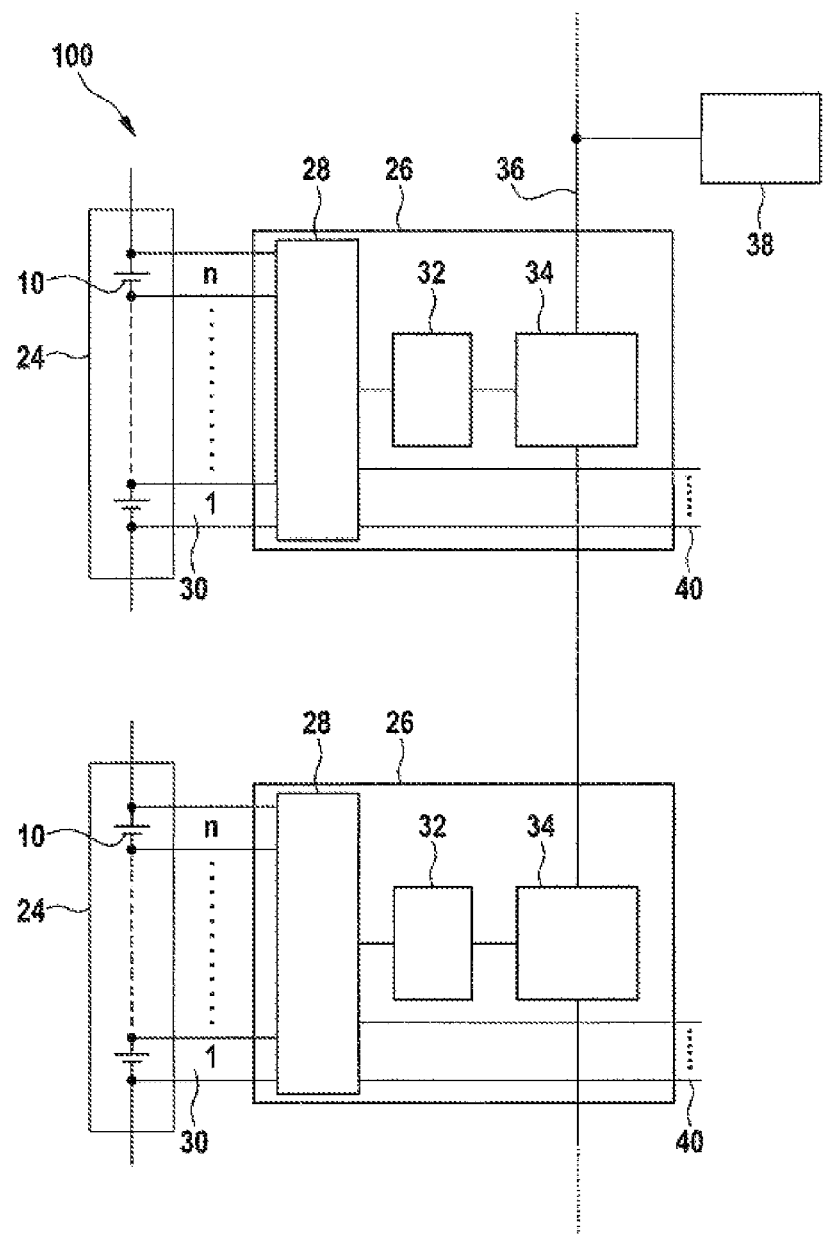
FIG. 2 shows an architecture for a cell voltage sensing unit based on the prior art.
Figure 3:
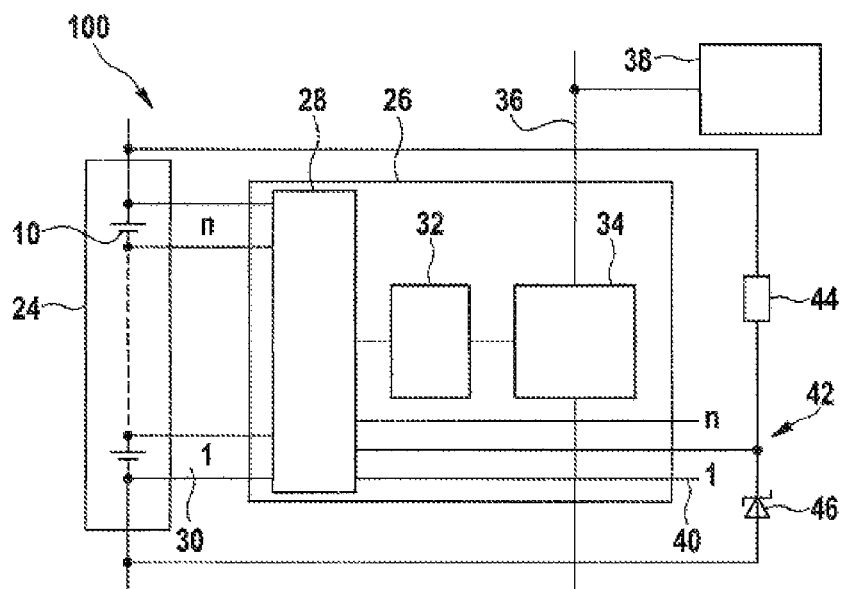
FIG. 3 shows a first exemplary embodiment of a battery system according to the disclosure.

FIG. 3 shows a battery system 100 based on a first embodiment of the invention. A multiplicity of battery cells 10 are connected in series and are combined in a module 24. A multiplexer 28 combines the cell voltages of the individual battery cells 10 and feeds them into a communication bus 36 via an analog-to-digital converter 32 and a gateway 34. The microcontroller 38 is used for the voltage evaluation in a manner which is known per se.

In addition, one of the auxiliary connections 40 of the multiplexer 28 has a constant auxiliary voltage applied to it. This constant auxiliary voltage is provided by means of a circuit arrangement 42 which comprises a resistor 44 and a Zener diode 46. This taps off a constant voltage of 2.5 V, for example, across the module 24 and applies it to the auxiliary connection 40 of the multiplexer 28. This auxiliary voltage is likewise made available to the communication bus 36 and hence to the microcontroller 38 via the cell voltage sensing unit 26, that is to say via the multiplexer 28, the analog-to-digital converter 32 and to the gateway 34. The microcontroller 38 monitors the signal arriving thereon for the presence of the defined known auxiliary voltage, in this case of 2.5 V, for example. If this auxiliary voltage is likewise identified, it is possible to infer that the cell voltage sensing unit 26, particularly the analog-to-digital controller 32, is working properly.

Figure 4:
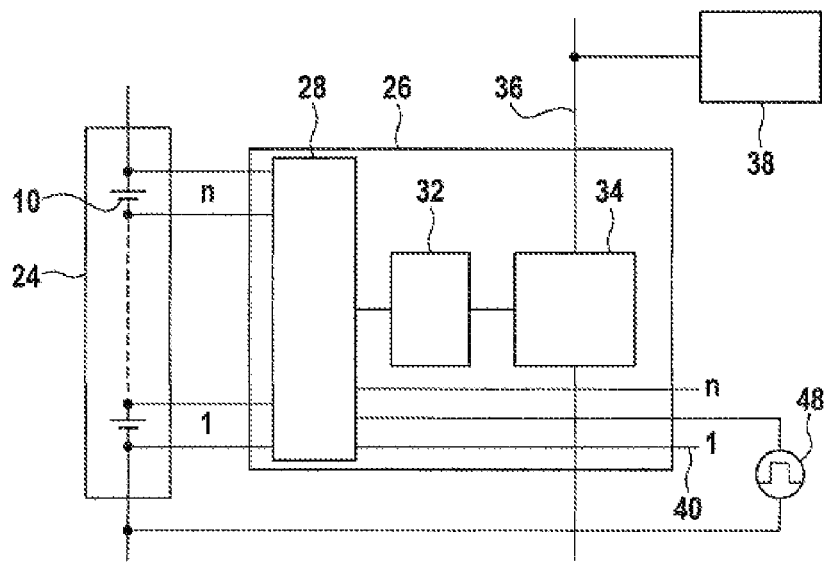
FIG. 4 shows a second exemplary embodiment of a battery system according to the disclosure.

FIG. 4 shows a second embodiment of the disclosure for a battery system 100. The same parts as in the preceding figures are provided with the same reference symbols and are not explained again.

According to FIG. 4, one of the auxiliary connections 40 of the multiplexer 28 is connected to a square wave oscillator 48. The square wave oscillator taps off a voltage and provides a square wave voltage having an alternating high level and low level. At least one of the levels of the square wave oscillator 48 is set to a known defined magnitude. By way of example, the high level is a value of 2.5 V and the low value is a value of 0.5 V. This square wave signal is fed onto the communication bus 36 via the multiplexer 28, the analog-to-digital converter 32 to the gateway 34 and is therefore available to the microcontroller 38. The microcontroller 38 knows the expected pulsating voltage profile of the oscillator 48, particularly one from the expected high level or low level. If this level is applied at the expected frequency prescribed by the oscillator 48, it is possible to infer a correct response from the cell voltage sensing unit 26. If this expected pulsating signal is not applied or if the pulsating signal but not the expected voltage level is applied, it is possible to infer a malfunction in the cell voltage sensing unit 26.

The invention claimed is:

1. A battery system, comprising:
    an evaluation unit;
    an analog-to-digital converter;
    a communication bus connected to the evaluation unit;
    an auxiliary voltage source configured to provide a predetermined voltage having a predefined magnitude and frequency, the predetermined voltage being known to the evaluation unit;
    a multiplexer having an output and a plurality of selectable inputs, the output being connected via the analog-to-digital converter to the communication bus, at least one of the plurality of selectable inputs being connected to the auxiliary voltage source, the multiplexer being configured to provide the predetermined voltage to the communication bus via the analog-to-digital converter; and
    at least one battery module including a plurality of battery cells, each battery cell of the plurality of battery cells having an associated cell voltage sensing circuit configured to a sense cell voltage of the respective battery cell, each the cell voltage sensing circuit being connected to at least one of the plurality of selectable inputs of the multiplexer,
    wherein the evaluation unit is configured to:
        receive, on the communication bus, digitized values of the sensed cell voltages of the plurality of battery cells;
        detect, on the communication bus, digitized values of the predetermined voltage provided by the auxiliary voltage source;
        determine that the analog-to-digital converter is not properly functioning in response to the digitized values of the predetermined voltage no longer being detected on the communication bus; and
        determine that the analog-to-digital converter is not properly functioning in response to the digitized values of the predetermined voltage detected on the communication not having the predefined magnitude and frequency.

2. The battery system as claimed in claim 1, wherein the auxiliary voltage source is configured to provide the predetermined voltage as a low frequency oscillating voltage.

3. The battery system as claimed in claim 2, wherein the auxiliary voltage source is configured to provide the predetermined voltage as a square wave.

4. A method for monitoring a battery system having at least one battery module having a plurality of battery cells, each battery cell of the plurality of battery cells having an associated cell voltage sensing circuit, comprising:
- sensing a cell voltage for each battery cell of the plurality of battery cells with the associated cell voltage sensing circuits;
- routing the sensed cell voltages for each battery cell to an evaluation unit via a plurality of selectable inputs of a multiplexer, the multiplexer having an output connected a communication bus via an analog-to-digital converter, the evaluation unit being connected to the communication bus;
- providing a predetermined voltage having a predefined magnitude and frequency with an auxiliary voltage source, the predetermined voltage being known to the evaluation unit;
- routing the predetermined voltage from the auxiliary voltage source to the evaluation via at least one of the plurality of selectable inputs of the multiplexer;
- receiving, with the evaluation unit, on the communication bus, digitized values of the sensed cell voltages of the plurality of battery cells;
- detecting, with the evaluation unit, on the communication bus, digitized values of the predetermined voltage provided by the auxiliary voltage source; and
- determining that the analog-to-digital converter is not properly functioning in response to the digitized values of the predetermined voltage no longer being detected on the communication bus; and
- determining that the analog-to-digital converter is not properly functioning in response to the digitized values of the predetermined voltage detected on the communication not having the predefined magnitude and frequency.

5. A motor vehicle comprising:
a drive system; and
a battery system connected to the drive system, the battery system including:
- an evaluation unit;
- an analog-to-digital converter;
- a communication bus connected to the evaluation unit;
- at least one auxiliary voltage source configured to provide a predetermined voltage having a predefined magnitude and frequency, the predetermined voltage being known to the evaluation unit;
- a multiplexer having an output and a plurality of selectable inputs, the output being connected via the analog-to-digital converter to the communication bus, one of the plurality of selectable inputs being connected to the at least one auxiliary voltage source, the multiplexer being configured to provide the predetermined voltage to the communication bus via the analog-to-digital converter; and
- at least one battery module including a plurality of battery cells, each battery cell of the plurality of battery cells having an associated cell voltage sensing circuit configured to a sense cell voltage of the respective battery cell, each the cell voltage sensing circuit being connected to at least one of the plurality of selectable inputs of the multiplexer, wherein the evaluation unit is configured to:
- receive, on the communication bus, digitized values of the sensed cell voltages of the plurality of battery cells;
- detect, on the communication bus, digitized values of the predetermined voltage provided by the at least one auxiliary voltage source; and
- determine that the analog-to-digital converter is not properly functioning in response to the digitized values of the predetermined voltage no longer being detected on the communication bus; and
- determine that the analog-to-digital converter is not properly functioning in response to the digitized values of the predetermined voltage detected on the communication not having the predefined magnitude and frequency.

* * * * *